(12) United States Patent
Mohammed

(10) Patent No.: US 9,953,914 B2
(45) Date of Patent: *Apr. 24, 2018

(54) SUBSTRATE-LESS STACKABLE PACKAGE WITH WIRE-BOND INTERCONNECT

(71) Applicant: Invensas Corporation, San Jose, CA (US)

(72) Inventor: Ilyas Mohammed, Santa Clara, CA (US)

(73) Assignee: Invensas Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/042,034

(22) Filed: Feb. 11, 2016

(65) Prior Publication Data

US 2016/0163639 A1    Jun. 9, 2016

Related U.S. Application Data

(60) Continuation of application No. 14/486,867, filed on Sep. 15, 2014, now Pat. No. 9,263,413, which is a
(Continued)

(51) Int. Cl.
*H01L 23/48* (2006.01)
*H01L 23/522* (2006.01)
(Continued)

(52) U.S. Cl.
CPC ........ *H01L 23/5226* (2013.01); *H01L 21/563* (2013.01); *H01L 21/76877* (2013.01);
(Continued)

(58) Field of Classification Search
CPC ..................................................... H01L 23/48
See application file for complete search history.

(56) References Cited

U.S. PATENT DOCUMENTS

| 3,289,452 A | 12/1966 | Koellner |
| 3,358,897 A | 12/1967 | Christensen |

(Continued)

FOREIGN PATENT DOCUMENTS

| CN | 1352804 A | 6/2002 |
| CN | 1641832 A | 7/2005 |

(Continued)

OTHER PUBLICATIONS

Extended European Search Report for Application No. EP13162975 dated Sep. 5, 2013.
(Continued)

*Primary Examiner* — Marc Armand

(57) ABSTRACT

A method for making a microelectronic unit includes forming a plurality of wire bonds on a first surface in the form of a conductive bonding surface of a structure comprising a patternable metallic element. The wire bonds are formed having bases joined to the first surface and end surfaces remote from the first surface. The wire bonds have edge surfaces extending between the bases and the end surfaces. The method also includes forming a dielectric encapsulation layer over a portion of the first surface of the conductive layer and over portions of the wire bonds such that unencapsulated portions of the wire bonds are defined by end surfaces or portions of the edge surfaces that are unconvered by the encapsulation layer. The metallic element is patterned to form first conductive elements beneath the wire bonds and insulated from one another by portions of the encapsulation layer.

4 Claims, 11 Drawing Sheets

Related U.S. Application Data division of application No. 13/477,532, filed on May 22, 2012, now Pat. No. 8,835,228.

(51) Int. Cl.
*H01L 23/538* (2006.01)
*H01L 23/00* (2006.01)
*H01L 25/065* (2006.01)
*H01L 25/10* (2006.01)
*H05K 3/40* (2006.01)
*H01L 21/768* (2006.01)
*H01L 21/56* (2006.01)

(52) U.S. Cl.
CPC .... *H01L 21/76892* (2013.01); *H01L 23/5389* (2013.01); *H01L 24/06* (2013.01); *H01L 24/18* (2013.01); *H01L 24/19* (2013.01); *H01L 24/20* (2013.01); *H01L 24/49* (2013.01); *H01L 24/96* (2013.01); *H01L 25/0657* (2013.01); *H01L 25/105* (2013.01); *H05K 3/4046* (2013.01); *H01L 21/568* (2013.01); *H01L 24/45* (2013.01); *H01L 2224/04042* (2013.01); *H01L 2224/04105* (2013.01); *H01L 2224/32145* (2013.01); *H01L 2224/32245* (2013.01); *H01L 2224/4569* (2013.01); *H01L 2224/45101* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/45565* (2013.01); *H01L 2224/45624* (2013.01); *H01L 2224/45655* (2013.01); *H01L 2224/45664* (2013.01); *H01L 2224/45669* (2013.01); *H01L 2224/49* (2013.01); *H01L 2224/73267* (2013.01); *H01L 2225/06524* (2013.01); *H01L 2225/06548* (2013.01); *H01L 2225/06558* (2013.01); *H01L 2225/1035* (2013.01); *H01L 2225/1052* (2013.01); *H01L 2225/1058* (2013.01); *H01L 2924/00011* (2013.01); *H01L 2924/00014* (2013.01); *H01L 2924/12042* (2013.01); *H01L 2924/15311* (2013.01); *H01L 2924/181* (2013.01); *H01L 2924/182* (2013.01); *H01L 2924/18162* (2013.01); *H01L 2924/191* (2013.01); *H01L 2924/19107* (2013.01); *H05K 2201/10287* (2013.01); *H05K 2203/1461* (2013.01)

(56) References Cited

U.S. PATENT DOCUMENTS

| | | | |
|---|---|---|---|
| 3,430,835 | A | 3/1969 | Grable et al. |
| 3,623,649 | A | 11/1971 | Keisling |
| 3,795,037 | A | 3/1974 | Luttmer |
| 3,900,153 | A | 8/1975 | Beerwerth et al. |
| 4,067,104 | A | 1/1978 | Tracy |
| 4,072,816 | A | 2/1978 | Gedney et al. |
| 4,213,556 | A | 7/1980 | Persson et al. |
| 4,327,860 | A | 5/1982 | Kirshenboin et al. |
| 4,422,568 | A | 12/1983 | Elles et al. |
| 4,437,604 | A | 3/1984 | Razon et al. |
| 4,604,644 | A | 8/1986 | Beckham et al. |
| 4,642,889 | A | 2/1987 | Grabbe |
| 4,667,267 | A | 5/1987 | Hernandez et al. |
| 4,695,870 | A | 9/1987 | Patraw |
| 4,716,049 | A | 12/1987 | Patraw |
| 4,725,692 | A | 2/1988 | Ishii et al. |
| 4,771,930 | A | 9/1988 | Gillotti et al. |
| 4,793,814 | A | 12/1988 | Zifcak et al. |
| 4,804,132 | A | 2/1989 | DiFrancesco |
| 4,902,600 | A | 2/1990 | Tamagawa et al. |
| 4,924,353 | A | 5/1990 | Patraw |
| 4,925,083 | A | 5/1990 | Farassat et al. |
| 4,955,523 | A | 9/1990 | Carlommagno et al. |
| 4,975,079 | A | 12/1990 | Beaman et al. |
| 4,982,265 | A | 1/1991 | Watanabe et al. |
| 4,998,885 | A | 3/1991 | Beaman |
| 4,999,472 | A | 3/1991 | Neinast et al. |
| 5,067,007 | A | 11/1991 | Otsuka et al. |
| 5,067,382 | A | 11/1991 | Zimmerman et al. |
| 5,083,697 | A | 1/1992 | Difrancesco |
| 5,095,187 | A | 3/1992 | Gliga |
| 5,133,495 | A | 7/1992 | Angulas et al. |
| 5,138,438 | A | 8/1992 | Masayuki et al. |
| 5,148,265 | A | 9/1992 | Khandros et al. |
| 5,148,266 | A | 9/1992 | Khandros et al. |
| 5,186,381 | A | 2/1993 | Kim |
| 5,189,505 | A | 2/1993 | Bartelink |
| 5,196,726 | A | 3/1993 | Nishiguchi et al. |
| 5,203,075 | A | 4/1993 | Angulas et al. |
| 5,214,308 | A | 5/1993 | Nishiguchi et al. |
| 5,220,489 | A | 6/1993 | Barreto et al. |
| 5,222,014 | A | 6/1993 | Lin |
| 5,238,173 | A | 8/1993 | Ura et al. |
| 5,241,456 | A | 8/1993 | Marcinkiewicz et al. |
| 5,316,788 | A | 5/1994 | Dibble et al. |
| 5,340,771 | A | 8/1994 | Rostoker |
| 5,346,118 | A | 9/1994 | Degani et al. |
| 5,371,654 | A | 12/1994 | Beaman et al. |
| 5,397,997 | A | 3/1995 | Tuckerman et al. |
| 5,438,224 | A | 8/1995 | Papageorge et al. |
| 5,455,390 | A | 10/1995 | DiStefano et al. |
| 5,468,995 | A | 11/1995 | Higgins, III |
| 5,494,667 | A | 2/1996 | Uchida et al. |
| 5,495,667 | A | 3/1996 | Farnworth et al. |
| 5,518,964 | A | 5/1996 | DiStefano et al. |
| 5,531,022 | A | 7/1996 | Beaman et al. |
| 5,536,909 | A | 7/1996 | DiStefano et al. |
| 5,541,567 | A | 7/1996 | Fogel et al. |
| 5,571,428 | A | 11/1996 | Nishimura et al. |
| 5,578,869 | A | 11/1996 | Hoffman et al. |
| 5,608,265 | A | 3/1997 | Kitano et al. |
| 5,615,824 | A | 4/1997 | Fjelstad et al. |
| 5,635,846 | A | 6/1997 | Beaman et al. |
| 5,656,550 | A | 8/1997 | Tsuji et al. |
| 5,659,952 | A | 8/1997 | Kovac et al. |
| 5,679,977 | A | 10/1997 | Khandros et al. |
| 5,688,716 | A | 11/1997 | DiStefano et al. |
| 5,718,361 | A | 2/1998 | Braun et al. |
| 5,726,493 | A | 3/1998 | Yamashita et al. |
| 5,731,709 | A | 3/1998 | Pastore et al. |
| 5,736,780 | A | 4/1998 | Murayama |
| 5,736,785 | A | 4/1998 | Chiang et al. |
| 5,766,987 | A | 6/1998 | Mitchell et al. |
| 5,787,581 | A | 8/1998 | DiStefano et al. |
| 5,801,441 | A | 9/1998 | DiStefano et al. |
| 5,802,699 | A | 9/1998 | Fjelstad et al. |
| 5,811,982 | A | 9/1998 | Beaman et al. |
| 5,821,763 | A | 10/1998 | Beaman et al. |
| 5,830,389 | A | 11/1998 | Capote et al. |
| 5,831,836 | A | 11/1998 | Long et al. |
| 5,839,191 | A | 11/1998 | Economy et al. |
| 5,854,507 | A | 12/1998 | Miremadi et al. |
| 5,874,781 | A | 2/1999 | Fogal et al. |
| 5,898,991 | A | 5/1999 | Fogel et al. |
| 5,908,317 | A | 6/1999 | Heo |
| 5,912,505 | A | 6/1999 | Itoh et al. |
| 5,948,533 | A | 9/1999 | Gallagher et al. |
| 5,953,624 | A | 9/1999 | Bando et al. |
| 5,971,253 | A | 10/1999 | Gilleo et al. |
| 5,973,391 | A | 10/1999 | Bischoff et al. |
| 5,977,618 | A | 11/1999 | DiStefano et al. |
| 5,980,270 | A | 11/1999 | Fjelstad et al. |
| 5,989,936 | A | 11/1999 | Smith et al. |
| 5,994,152 | A | 11/1999 | Khandros et al. |
| 6,000,126 | A | 12/1999 | Pai |
| 6,002,168 | A | 12/1999 | Bellaar et al. |
| 6,032,359 | A | 3/2000 | Carroll |
| 6,038,136 | A | 3/2000 | Weber |
| 6,052,287 | A | 4/2000 | Palmer et al. |

(56) References Cited

U.S. PATENT DOCUMENTS

| | | |
|---|---|---|
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,812,575 B2 | 11/2004 | Furusawa |
| 6,815,257 B2 | 11/2004 | Yoon et al. |
| 6,825,552 B2 * | 11/2004 | Light ............... H01L 23/49816 257/687 |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,485 B2 | 5/2006 | Bang et al. |
| 7,061,079 B2 | 6/2006 | Weng et al. |
| 7,067,911 B1 | 6/2006 | Lin et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |

(56) References Cited

U.S. PATENT DOCUMENTS

| | | |
|---|---|---|
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,504,284 B2 | 3/2009 | Ye et al. |
| 7,504,716 B2 | 3/2009 | Abbott |
| 7,517,733 B2 | 4/2009 | Camacho et al. |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,621,436 B2 | 11/2009 | Mii et al. |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,683,482 B2 | 3/2010 | Nishida et al. |
| 7,696,631 B2 | 4/2010 | Beaulieu et al. |
| 7,706,144 B2 | 4/2010 | Lynch |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,902,644 B2 | 3/2011 | Huang et al. |
| 7,911,805 B2 | 3/2011 | Haba |
| 7,919,846 B2 | 4/2011 | Hembree |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,008,121 B2 | 8/2011 | Choi et al. |
| 8,012,797 B2 | 9/2011 | Shen et al. |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Tessera |
| 8,115,283 B1 | 2/2012 | Bolognia et al. |
| 8,119,516 B2 | 2/2012 | Endo |
| 8,120,054 B2 | 2/2012 | Seo et al. |
| 8,138,584 B2 | 3/2012 | Wang et al. |
| 8,143,141 B2 | 3/2012 | Sun et al. |
| 8,158,888 B2 | 4/2012 | Shen et al. |
| 8,183,682 B2 | 5/2012 | Groenhuis et al. |
| 8,194,411 B2 | 6/2012 | Leung et al. |
| 8,198,716 B2 | 6/2012 | Periaman et al. |
| 8,213,184 B2 | 7/2012 | Knickerbocker |
| 8,217,502 B2 | 7/2012 | Ko |
| 8,232,141 B2 | 7/2012 | Choi et al. |
| 8,263,435 B2 | 9/2012 | Choi et al. |
| 8,264,091 B2 | 9/2012 | Cho et al. |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |

(56) References Cited

U.S. PATENT DOCUMENTS

| | | |
|---|---|---|
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,569,892 B2 | 10/2013 | Mori et al. |
| 8,580,607 B2 | 11/2013 | Haba |
| 8,618,659 B2 | 12/2013 | Sato et al. |
| 8,624,374 B2 | 1/2014 | Ding et al. |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,680,662 B2 | 3/2014 | Haba et al. |
| 8,680,677 B2 | 3/2014 | Wyland |
| 8,680,684 B2 | 3/2014 | Haba et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,811,055 B2 | 8/2014 | Yoon |
| 8,816,404 B2 | 8/2014 | Kim et al. |
| 8,836,136 B2 | 9/2014 | Chau et al. |
| 8,836,147 B2 | 9/2014 | Uno et al. |
| 8,841,765 B2 | 9/2014 | Haba et al. |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,963,339 B2 | 2/2015 | He et al. |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |
| 9,177,832 B2 | 11/2015 | Camacho et al. |
| 9,196,586 B2 | 11/2015 | Chen et al. |
| 9,196,588 B2 | 11/2015 | Leal |
| 9,214,434 B1 | 12/2015 | Kim et al. |
| 9,224,647 B2 | 12/2015 | Koo et al. |
| 9,224,717 B2 | 12/2015 | Sato |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,452 B2 | 4/2016 | Chen et al. |
| 9,324,696 B2 | 4/2016 | Choi et al. |
| 9,349,706 B2 | 5/2016 | Co et al. |
| 9,362,161 B2 | 6/2016 | Chi et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0042925 A1 | 11/2001 | Yamamoto et al. |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125556 A1 | 9/2002 | Oh et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |

(56) References Cited

U.S. PATENT DOCUMENTS

| | | |
|---|---|---|
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0285246 A1 | 6/2005 | Haba et al. |
| 2005/0151235 A1 | 7/2005 | Yokoi |
| 2005/0151238 A1 | 7/2005 | Yamunan |
| 2005/0161814 A1 | 7/2005 | Mizukoshi et al. |
| 2005/0173805 A1 | 8/2005 | Damberg et al. |
| 2005/0173807 A1 | 8/2005 | Zhu et al. |
| 2005/0176233 A1 | 8/2005 | Joshi et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2006/0087013 A1 | 4/2006 | Hsieh |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2007/0010086 A1 | 1/2007 | Hsieh |
| 2007/0015353 A1 | 1/2007 | Craig et al. |
| 2007/0080360 A1 | 4/2007 | Mirsky et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0032519 A1 | 2/2008 | Murata |
| 2008/0042265 A1 | 2/2008 | Merilo et al. |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111233 A1* | 5/2008 | Pendse .............. H01L 23/3121 257/712 |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0217708 A1 | 9/2008 | Reisner et al. |
| 2008/0277776 A1 | 11/2008 | Enomoto |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0008796 A1 | 1/2009 | Eng et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0072375 A1* | 3/2009 | Song .................... H01L 21/563 257/686 |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0160065 A1 | 6/2009 | Haba et al. |
| 2009/0166664 A1 | 7/2009 | Park et al. |
| 2009/0189288 A1 | 7/2009 | Beaman et al. |
| 2009/0194829 A1 | 8/2009 | Chung et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1* | 10/2009 | Pagaila ............... H01L 21/6835 257/686 |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0044860 A1 | 2/2010 | Haba et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0142170 A1* | 6/2010 | Kim .................... H01L 21/6835 361/762 |
| 2010/0193937 A1 | 8/2010 | Nagamatsu et al. |
| 2010/0200981 A1 | 8/2010 | Huang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0115081 A1 | 5/2011 | Osumi |
| 2011/0147911 A1 | 6/2011 | Kohl et al. |
| 2011/0157834 A1 | 6/2011 | Wang |
| 2011/0272449 A1 | 11/2011 | Pirkle et al. |

(56) References Cited

U.S. PATENT DOCUMENTS

| | | |
|---|---|---|
| 2012/0001336 A1 | 1/2012 | Zeng et al. |
| 2012/0043655 A1 | 2/2012 | Khor et al. |
| 2012/0063090 A1 | 3/2012 | Hsaio et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0119380 A1 | 5/2012 | Haba |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0049218 A1 | 2/2013 | Gong et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0328178 A1 | 12/2013 | Bakalski et al. |
| 2014/0035892 A1 | 2/2014 | Shenoy et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0225248 A1 | 8/2014 | Henderson et al. |
| 2014/0239479 A1 | 8/2014 | Start |
| 2014/0239490 A1 | 8/2014 | Wang |
| 2014/0308907 A1 | 10/2014 | Chen |
| 2014/0312503 A1 | 10/2014 | Seo |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0172268 A1 | 6/2016 | Katkar et al. |
| 2016/0200566 A1 | 7/2016 | Ofner et al. |
| 2016/0225692 A1 | 8/2016 | Kim et al. |

FOREIGN PATENT DOCUMENTS

| | | | |
|---|---|---|---|
| CN | 1877824 A | | 12/2006 |
| CN | 101409241 A | | 4/2009 |
| CN | 101449375 A | | 6/2009 |
| CN | 101675516 A | | 3/2010 |
| CN | 101819959 A | | 9/2010 |
| CN | 102324418 A | | 1/2012 |
| DE | 102009001461 A1 | | 9/2010 |
| EP | 920058 | | 6/1999 |
| EP | 1449414 A1 | | 6/2004 |
| EP | 2234158 A1 | | 9/2010 |
| JP | S51-050661 | | 5/1976 |
| JP | 59189069 A | | 10/1984 |
| JP | 61125062 A | | 6/1986 |
| JP | S62158338 A | | 7/1987 |
| JP | 62-226307 | | 10/1987 |
| JP | 1012769 A | | 1/1989 |
| JP | 64-71162 | | 3/1989 |
| JP | H04-346436 A | | 12/1992 |
| JP | 62-68015 A | | 9/1994 |
| JP | H06333931 A | | 12/1994 |
| JP | 07-122787 A | | 5/1995 |
| JP | 09505439 | | 5/1997 |
| JP | H1065054 A | | 3/1998 |
| JP | H10135220 A | | 5/1998 |
| JP | H10135221 A | | 5/1998 |
| JP | 1118364 | | 1/1999 |
| JP | 11-074295 A | | 3/1999 |
| JP | 11135663 A | | 5/1999 |
| JP | H11-145323 A | | 5/1999 |
| JP | 11251350 A | | 9/1999 |
| JP | H11260856 A | | 9/1999 |
| JP | 11317476 | | 11/1999 |
| JP | 2001196407 A | | 7/2001 |
| JP | 2001326236 A | | 11/2001 |
| JP | 2002289769 A | | 10/2002 |
| JP | 2003122611 A | | 4/2003 |
| JP | 2003-174124 | | 6/2003 |
| JP | 2003307897 A | | 10/2003 |
| JP | 2004031754 A | | 1/2004 |
| JP | 2004047702 A | | 2/2004 |
| JP | 2004-172157 A | | 6/2004 |
| JP | 2004-200316 | | 7/2004 |
| JP | 2004281514 A | | 10/2004 |
| JP | 2004-319892 A | | 11/2004 |
| JP | 2004327855 A | | 11/2004 |
| JP | 2004327856 A | | 11/2004 |
| JP | 2004343030 A | | 12/2004 |
| JP | 2005011874 A | | 1/2005 |
| JP | 2005033141 A | | 2/2005 |
| JP | 2003377641 A | | 6/2005 |
| JP | 2005142378 A | | 6/2005 |
| JP | 2005175019 A | | 6/2005 |
| JP | 2003426392 A | | 7/2005 |
| JP | 2005183880 A | | 7/2005 |
| JP | 2005183923 A | | 7/2005 |
| JP | 2005203497 A | | 7/2005 |
| JP | 2005302765 A | | 10/2005 |
| JP | 2006108588 A | | 4/2006 |
| JP | 2006186086 A | | 7/2006 |
| JP | 2006344917 | | 12/2006 |
| JP | 2007123595 A | | 5/2007 |
| JP | 2007-208159 A | | 8/2007 |
| JP | 2007234845 A | | 9/2007 |
| JP | 2007287922 A | | 11/2007 |
| JP | 2007-335464 | | 12/2007 |
| JP | 2008166439 A | | 7/2008 |
| JP | 2008171938 A | | 7/2008 |
| JP | 2008251794 A | | 10/2008 |
| JP | 2008277362 A | | 11/2008 |
| JP | 2008306128 A | | 12/2008 |
| JP | 2009004650 A | | 1/2009 |
| JP | 2009044110 A | | 2/2009 |
| JP | 2009506553 | | 2/2009 |
| JP | 2009508324 A | | 2/2009 |
| JP | 2009528706 A | | 8/2009 |
| JP | 2009260132 A | | 11/2009 |
| JP | 2010103129 A | | 5/2010 |
| JP | 2010192928 A | | 9/2010 |
| JP | 2010199528 A | | 9/2010 |
| JP | 2010206007 A | | 9/2010 |
| KR | 100265563 | | 9/2000 |
| KR | 20010061849 A | | 7/2001 |
| KR | 2001-0094894 A | | 11/2001 |
| KR | 10-0393102 | | 7/2002 |
| KR | 20020058216 A | | 7/2002 |
| KR | 20060064291 A | | 6/2006 |
| KR | 10-2007-0058680 A | | 6/2007 |
| KR | 20080020069 A | | 3/2008 |
| KR | 100865125 B1 | | 10/2008 |
| KR | 20080094251 A | | 10/2008 |
| KR | 100886100 B1 | | 2/2009 |
| KR | 20090033605 A | | 4/2009 |
| KR | 20090123680 A | | 12/2009 |
| KR | 20100033012 A | | 3/2010 |
| KR | 10-2010-0050750 A | | 5/2010 |
| KR | 20100062315 A | | 6/2010 |
| KR | 101011863 B1 | | 1/2011 |
| KR | 20120075855 A | | 7/2012 |
| KR | 20150012285 A | | 2/2015 |
| TW | 200539406 A | | 12/2005 |
| TW | 200810079 A | | 2/2008 |
| TW | 200849551 A | | 12/2008 |
| TW | 200933760 A | | 8/2009 |
| TW | 201023277 A | | 6/2010 |
| TW | 201250979 A | | 12/2012 |
| WO | 02/13256 A1 | | 2/2002 |
| WO | 03-045123 A1 | | 5/2003 |
| WO | 2004077525 A2 | | 9/2004 |
| WO | 2006050691 A2 | | 5/2006 |
| WO | 2007101251 A2 | | 9/2007 |
| WO | 2008065896 A1 | | 6/2008 |
| WO | 2008120755 A1 | | 10/2008 |
| WO | 2009096950 A1 | | 8/2009 |
| WO | 2010041630 A1 | | 4/2010 |

(56) References Cited

FOREIGN PATENT DOCUMENTS

| | | | |
|---|---|---|---|
| WO | 2010101163 | A1 | 9/2010 |
| WO | 2012067177 | A1 | 5/2012 |
| WO | 2013059181 | A1 | 4/2013 |
| WO | 2013065895 | A1 | 5/2013 |
| WO | 2014107301 | A1 | 7/2014 |

OTHER PUBLICATIONS

International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
Japanese Office Action for Application No. 2013-509325 dated Oct. 18, 2013.
Office Action from U.S. Appl. No. 12/769,930 dated May 5, 2011.
Taiwan Office Action, Application No. 100125522, dated Jan. 27, 2014.
"EE Times Asia" [online]. [Retrieved Aug. 5, 2010]. Retrieved from internet. <http://www.eetasia.com/ART_8800428222_480300_nt_dec52276.HTM>, 4 pages. (Freescale).
"Wafer Level Stack—WDoD", [online]. [Retrieved Aug. 5. 2010]. Retrieved from the internet. <http://www.3d-plus.com/techno-wafer-level-stack-wdod.php>, 2 pages.
Bang, U.S. Appl. No. 10/656,534, filed Sep. 5, 2003.
International Search Report and Written Opinion for Application No. PCT/US2011/044346 dated May 11, 2012.
International Search Report and Written Opinion for Application No. PCT/US2012/060402 dated Apr. 2, 2013.
International Search Report and Written Opinion for Application No. PCT/US2013/026126 dated Jul. 25, 2013.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, dated Apr. 5, 2006.
Jin, Yonggang et al., "STM 3D-IC Package and 3D eWLB Development," STMicroelectronics Singapore/STMicroelectronics France May 21, 2010.
Kim et al., "Application of Through Mold Via (TMV) as PoP base package", 6 pages. (2008).
Kim, et al., Application of Through Mold Via (TMV) as PoP base package, ECTC, 2008.
Korean Office Action for Application No. 10-2011-0041843 dated Jun. 20, 2011.
Korean Search Report KR10-2011-0041843 dated Feb. 24, 2011.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Partial International Search Report for Application No. PCT/US2012/060402 dated Feb. 21, 2013.
Partial International Search Report for Application No. PCT/US2013/026126 dated Jun. 17, 2013.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
Yoon, PhD, Seung Wook, "Next Generation Wafer Level Packaging Solution for 3D integration," May 2010, Stats ChipPAC Ltd.
Office Action for Taiwan Application 100125521, dated Dec. 20 2013.
Brochure, "High Performance BVA PoP Package for Mobile Systems," Invensas Corporation, May 2013, 20 pages.
Brochure, "Invensas Bva PoP for Mobile Computing: Ultra High 10 Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
IBM et al., "Method of Producing Thin-Film Wirings with Vias," IBM Technical Disclosure Bulletin, Apr. 1, 1989, IBM corp., (Thornwood), US-ISSN 0018-8689, vol. 31, No. 11, pp. 209-210, https://priorart.ip.com.
International Search Report and Written Opinion for Appln. No. PCT/US2011/024143, dated Jan. 17, 2012.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Search Report and Written Opinion for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-520776, dated Apr. 21, 2015.
Japanese Office Action for Appln. No. 2013-520777, dated May 22, 2015.
Korean Office Action for Appn. 2014-7025992, dated Feb. 5, 2015.
NTK HTCC Package General Design Guide, Communication Media Components Group, NGK Spark Plug Co., Ltd., Komaki, Aichi, Japan, Apr. 2010, 32 pages.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
U.S. Appl. No. 13/477,532, dated May 22, 2012.
Written Opinion for Appln. No. PCT/US2014/050125, dated Jul. 15, 2015.
Campos et al., "System in Package Solutions Using Fan-Out Wafer Level Packaging Technology," SEMI Networking Day, Jun. 27, 2013, 31 pages.

(56) References Cited

OTHER PUBLICATIONS

Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.

* cited by examiner

DETAIL A

DETAIL B

DETAIL C

DETAIL D

DETAIL E

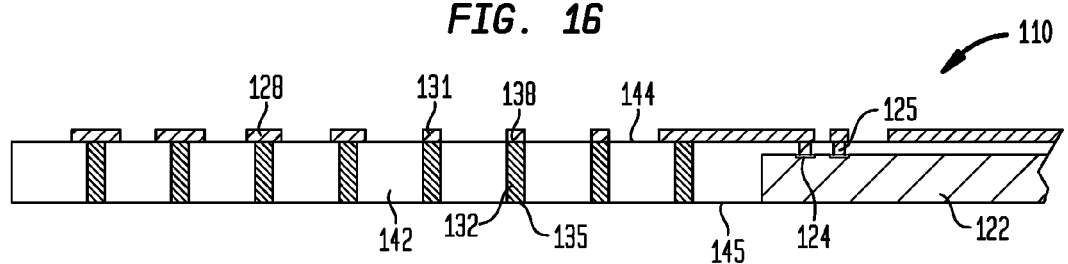
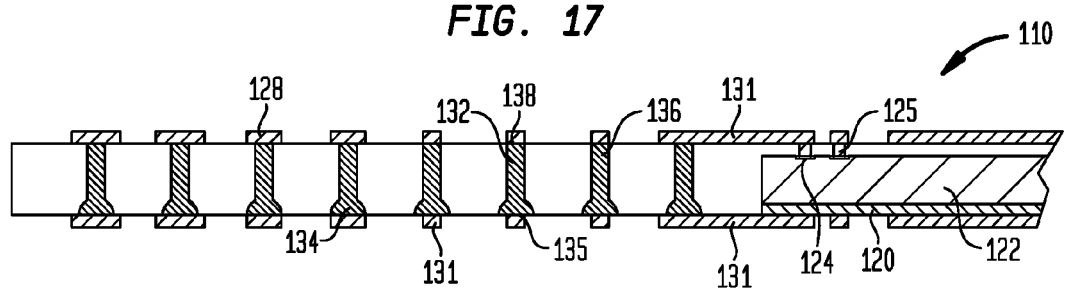

DETAIL F

DETAIL G

SUBSTRATE-LESS STACKABLE PACKAGE WITH WIRE-BOND INTERCONNECT

CROSS-REFERENCE TO RELATED APPLICATIONS

The present application is a continuation of U.S. patent application Ser. No. 14/486,867, filed Sep. 15, 2014, which is a divisional of U.S. patent application Ser. No. 13/477,532, filed May 22, 2012, (now U.S. Pat. No. 8,835,228), the disclosure of each of which is incorporated herein by reference in its entirety for all purposes consistent herewith.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Despite all of the above-described advances in the art, still further improvements in making and testing microelectronic packages would be desirable.

BRIEF SUMMARY OF THE INVENTION

An aspect of the present disclosure relates to a method for making a microelectronic unit. The method includes forming a plurality of wire bonds on a first surface in the form of a conductive bonding surface of a structure comprising a patternable metallic element. The wire bonds are formed having bases joined to the first surface and end surfaces remote from the bases and remote from the first surface. The wire bonds further have edge surfaces extending between the bases and the end surfaces. The method also includes forming a dielectric encapsulation layer over at least a portion of the first surface of the conductive layer and over portions of the wire bonds such that unencapsulated portions of the wire bonds are defined by at least one of the end surface or a portion of the edge surface thereof that is uncovered by the encapsulation layer. Then, the metallic element is selectively patterned to form first conductive elements insulated from one another by at least portions of the encapsulation layer. At least some of the wire bonds are disposed atop the first conductive elements.

A microelectronic element can be included in the structure and electrically connected with the conductive layer when the step of removing portions of the conductive layer is performed. The step of forming the dielectric encapsulation layer can be carried out with the microelectronic element electrically connected with the conductive layer and such that the encapsulation layer at least partially covers at least one surface thereof. At least some of the first conductive elements can be electrically connected between respective ones of the wire bonds and the microelectronic element.

An example of the method can further include the step of forming a redistribution layer over the second surface of the encapsulation layer. The redistribution layer can include conductive contacts displaced in at least one lateral direction from the unexposed portions of the wire bonds.

At least some of the wire bonds can be formed such that the end surfaces thereof are displaced in one or more lateral directions from the bases thereof. In an example, the bases of the wire bonds can be arranged in a first pattern having a first minimum pitch and the unencapsulated portions of the wire bonds can be arranged in a pattern having a second minimum pitch that is greater than the first minimum pitch. Alternatively, the bases can be arranged in a first pattern having a first minimum pitch and the unencapsulated portions of the wire bonds can be arranged in a pattern having a second minimum pitch that is less than the first minimum pitch.

The method can further include forming second conductive elements overlying the second surface of the dielectric layer. At least some of the second conductive elements can be connected with respective ones of at least some of the unencapsulated portions of the wire bonds.

The step of selectively removing portions of the conductive layer can include forming at least some first conductive elements as contact pads to which bases of wire bonds that are not electrically connected with other elements of the unit are electrically connected.

The method can further include the step of thinning the unit by one of grinding or polishing. In an example, the encapsulation layer can be formed having an initial thickness such that the end surfaces of the wire bonds are substantially covered, and the step of thinning the unit can include removing a portion of the encapsulation layer such that the end surfaces become unencapsulated by the encapsulation layer.

The step of forming the encapsulation layer can include dispensing an encapsulant onto the first surface of the conductive layer and at least edge surfaces of the wire bonds. Further, the step of forming the encapsulation layer can include molding an encapsulant in contact with the conductive layer, at least edge surfaces of the wire bonds, and at least one surface of the microelectronic element.

The method can further include removing a carrier from a surface of the conductive layer opposite the wire bonds prior to performing the step of selectively removing portions of the conductive layer.

In an embodiment, the conductive layer can have a thickness of less than 20 microns.

Another aspect of the present disclosure relates to a method for making a microelectronic package. The method can include forming a plurality of wire bonds on a first surface of a conductive layer of an in process unit. The in-process unit has at least one microelectronic element joined thereto that is electrically connected with portions thereof. The wire bonds are formed having bases joined to the first surface and end surfaces remote from the bases and remote from the first surface. The wire bonds further have edge surfaces extending between the bases and the end surfaces. The method also includes forming a dielectric encapsulation layer over at least a portion of the first surface of the conductive layer, over at least a portion of the at least one microelectronic element, and over portions of the wire bonds such that unencapsulated portions of the wire bonds are defined by at least one of the end surface or a portion of the edge surface thereof that is uncovered by the encapsulation layer. Portions of the conductive layer are selectively removed to form first conductive elements thereof. At least some of the first conductive elements are electrically connected with at least some of the wire bonds, and at least some of the first conductive elements include at least some of the portions of the conductive layer with which the microelectronic element is electrically connected.

Another aspect of the present disclosure relates to a method for making a microelectronic unit. The method includes forming a plurality of wire bonds on a first surface that is a conductive bonding surface of a structure comprising a patternable metallic element. The wire bonds have bases joined to the first surface and end surfaces remote from the bases and remote from the first surface. The wire bonds further have edge surfaces extending between the bases and the end surfaces. When forming the wire bonds, the conductive layer includes a plurality of regions attached to one another at at least some edges thereof. The method also includes forming a dielectric encapsulation layer over at least a portion of the first surface of the conductive layer and over portions of the wire bonds, such that unencapsulated portions of the wire bonds are defined by at least one of the end surface or a portion of the edge surface thereof that is uncovered by the encapsulation layer, wherein when performing the step of selectively removing portions of the encapsulation layer, a plurality of microelectronic elements are joined to the conductive layer, in the form of an in-process unit having at least one microelectronic element electrically connected with each of at least some of the regions of the conductive layer. The metallic element is then selectively patterned to form first conductive elements insulated from one another by at least portions of the encapsulation layer. At least some of the wire bonds are disposed atop the first conductive elements. The in-process unit is then severed into a plurality of microelectronic units, each including the first conductive elements of a region of the conductive layer and the at least one microelectronic element electrically connected therewith.

Another aspect of the present disclosure relates to a method for making a microelectronic assembly. The method includes making a first microelectronic package, including forming a plurality of wire bonds on a first surface of a conductive layer of an in process unit. The in-process unit has at least one microelectronic element joined thereto and electrically connected with portions thereof. The wire bonds are formed having bases joined to the first surface and end surfaces remote from the bases and remote from the first surface. The wire bonds further have edge surfaces extending between the bases and the end surfaces. Forming the first microelectronic package also includes forming a dielectric encapsulation layer over at least a portion of the first surface of the conductive layer, over at least a portion of the at least one microelectronic element, and over portions of the wire bonds such that unencapsulated portions of the wire bonds are defined by at least one of the end surface or a portion of the edge surface thereof that is uncovered by the encapsulation layer. Portions of the conductive layer are then selectively removed to form first conductive elements thereof. At least some of the first conductive elements are electrically connected with at least some of the wire bonds and at least some of the first conductive elements include at least some of the portions of the conductive layer with which the microelectronic element is electrically connected. The method also includes joining the first microelectronic package with a second microelectronic package overlying the second surface of the encapsulation layer of the first package. The second microelectronic package includes a plurality of contacts exposed at a first surface thereof. Joining the first microelectronic package with the second microelectronic package includes electrically connecting the unencapsulated portions of the wire bonds of the first microelectronic package with the contacts of the second microelectronic package.

Another aspect of the present disclosure relates to a microelectronic package including at least one microelectronic element. The package further includes first electrically conductive elements including terminals exposed at a mounting surface of the package. At least some of the first conductive elements are electrically connected to the at least one microelectronic element through vias integrally formed with the first conductive elements. The package further includes wire bonds having bases joined to respective ones of the conductive elements and adjacent the first surface of the dielectric encapsulation layer and end surfaces remote from the bases. Each wire bond defines an edge surface extending between the base and the end surface thereof. The package also includes a dielectric encapsulation layer having a first surface and a second surface remote from the first surface. At least a portion of the first surface is exposed at the mounting surface of the package. The dielectric encapsulation layer fills spaces between the wire bonds such that the wire bonds are separated from one another by the encapsulation layer. Unencapsulated portions of the wire bonds are defined by at least portions of the end surfaces of the wire bonds that are uncovered by the encapsulation layer at the second surface thereof.

At least some of the unencapsulated portions of the wire bonds can be displaced in at least one lateral direction from the respective bases thereof.

The package can further include a second microelectronic element. In an example the first microelectronic element can include contacts exposed at a front face thereof that are disposed toward the first surface of the dielectric layer, and the second microelectronic element can include contacts exposed at a front face thereof that is disposed toward the second surface of the dielectric layer. In such an example, the package can further include second conductive elements exposed at the second surface of the encapsulation layer. At least some of the second conductive elements can be connected between respective ones of the contacts of the second microelectronic element and respective ones of the unencapsulated wire bond portions. The first and second microelectronic elements can be electrically connected by at least one wire bond that is electrically connected with at least one contact of the first microelectronic element and at least one contact of the second microelectronic element. Alternatively, the second microelectronic element can be connected with one of the second conductive elements by a wire bond joined between one of the contacts of the second microelectronic element and a respective one of the second microelectronic elements. In another example, the first and second microelectronic elements can be electrically connected by a wire bond joined to a contact of the second microelectronic element and a respective one of the conductive elements exposed at the first surface of the encapsulation layer.

A microelectronic assembly can include a first microelectronic package as described above and a second microelectronic package that includes a microelectronic element and terminals exposed at a surface of the second microelectronic package. The terminals can be electrically connected with the microelectronic element. Further, the second microelectronic package can overlie the first microelectronic package and can be bonded thereto with the terminals thereof electrically connected to at least some of the unencapsulated portions of the wire bonds of the first microelectronic package.

A system can include a microelectronic package, as described above and one or more electronic components.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 16 shows a side elevation view of a microelectronic package that can result from the method variation;

FIG. 17 shows a detail view of a portion of the package of FIG. 15 after an optional process step of another method variation;

DETAILED DESCRIPTION

Figure 7:
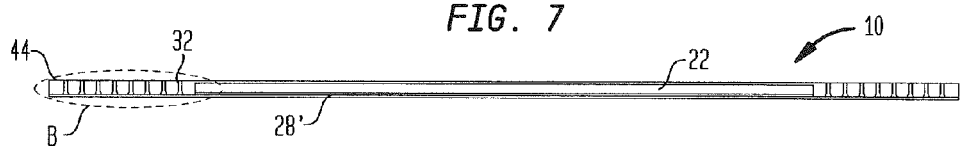
FIG. 7 shows a side elevation view of the in-process unit of FIG. 6.
Figure 8:
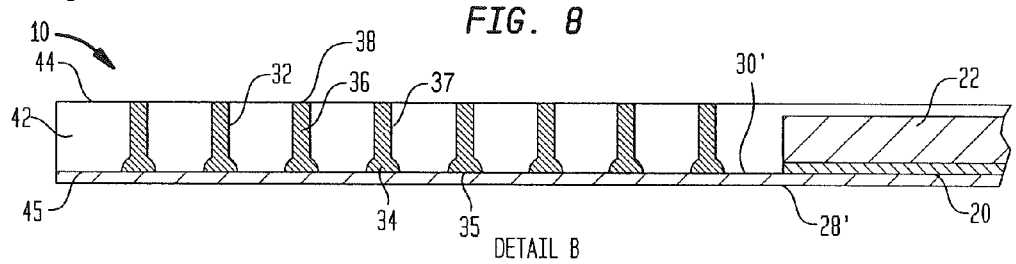
FIG. 8 shows a detail view of a portion of the in-process unit of FIG. 7 as indicated by area B or detail.
Figure 9:
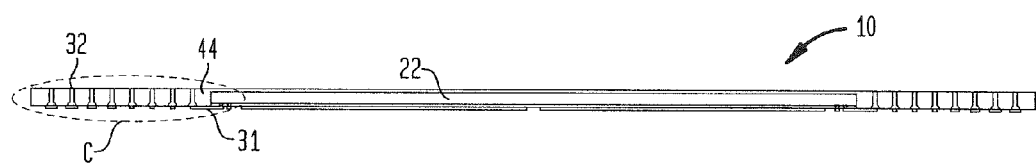
FIG. 9 shows a side elevation view of a microelectronic package that can result from the method.

Turning now to the figures, where similar numeric references are used to indicate similar features, there is shown in FIG. 9 a microelectronic unit or package 10 according to an embodiment of the disclosure, for which FIGS. 1-8 show various stages of formation of the microelectronic package according to a method in another embodiment of the disclosure. The embodiment of FIG. 9 is a microelectronic package 10 in the form of a packaged microelectronic element such as a semiconductor chip assembly that is used in computer or other electronic applications.

Figure 10:
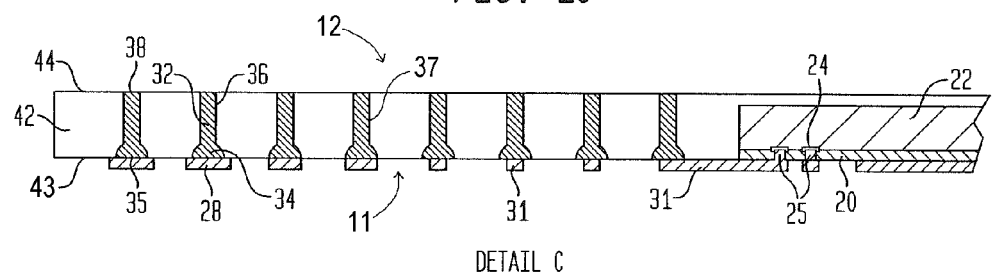
FIG. 10 shows a detail view of the package of FIG. 9 as indicted by area or detail C.

The microelectronic package 10 of FIG. 9 includes a microelectronic element 22. The microelectronic package 10 can be embedded within an encapsulation layer 42 or may be contacted by the encapsulation layer at one or more surfaces thereof, e.g., a front or rear surface or an edge surface extending between the front and rear surfaces. The encapsulation layer 42 has a thickness extending from a first surface 43 or 45 to a second surface 44. The first and second surfaces can be at least partially exposed at respective first and second mounting surfaces 11 and 12 of the packages 10. Such a thickness can be at least equal to a thickness of the microelectronic element 22, itself. As seen in FIG. 10, encapsulation layer 42 can further extend outwardly from the microelectronic element 22 in lateral directions, as also shown in the plan-view of FIG. 6. A plurality of wire bonds 32 are also embedded within encapsulation layer and extend between end surfaces 35 and 38 that are respectively uncovered by the encapsulation layer and which may be flush (e.g., co-planar) with surfaces 43 or 45 and 44. For purposes of this discussion, the first surface 43 or 45 may be described as being positioned opposite or remote from second surface 44. Such a description, as well as any other description of the relative position of elements used herein that refers to a vertical or horizontal position of such elements is made for illustrative purposes only to correspond with the position of the elements within the Figures, and is not limiting.

Microelectronic element 22 can be a semiconductor chip or another comparable device having a plurality of active or passive circuit elements therein or both active and passive circuit elements which may be in the form of an integrated passives on-chip ("IPOC"), among others. In the embodiment of FIG. 10, microelectronic element 22 has at least portions of edge and rear surfaces contacted (e.g., covered by) encapsulation layer 42. The microelectronic element 22 may be positioned such that its contacts 24 are adjacent the first mounting surface 11 of the package. Further, in such an arrangement, contacts 24 are connected with conductive elements that extend along first surface 43 or 45 of encapsulation layer 42 to electrically connect with wire bonds 32 at end surfaces 35, thereof, which can be defined by bases 34 of the respective wire bonds 32. Such bases 34 can be an artifact of the process used to form wire bonds 32, and can be in the shape of such bases 34 as formed by ball bonding, as shown, or by wedge bonding, stitch bonding or the like. In other embodiments, such as that shown in FIG. 16, bases can be partially or fully removed during fabrication, such as by a thinning process of grinding, lapping, polishing, or other suitable technique. Such thinning or other process can also reduce the height of the wire bonds 132 such that end surfaces 135 are defined as extremities of the wire bonds 132 that were above the bases. In an embodiment, the microelectronic contacts 24 can be electrically connected with conductive elements 28 by conductive (e.g., metalized) vias 25 that include vias deposited onto the contacts 24 of the microelectronic element such as by plating, sputtering, or vapor deposition of one or more metals, such as one or more of copper, nickel, chromium, aluminum, gold, titanium, tungsten, cobalt, or one or more alloys thereof, without limitation. In one example, conductive elements can be formed by depositing a liquid conductive matrix material having metallic and non-metallic components, and thereafter curing the deposited conductive matrix material. For example, a conductive matrix material can be deposited and used such as described in commonly owned U.S. patent application Ser. No. 13/158,797, the disclosure of which is incorporated by reference herein.

Conductive elements 28 can include respective "contacts" or "pads" that can be exposed at the second surface of encapsulation layer 42. As used in the present description, when an electrically conductive element is described as being "exposed at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is exposed at a surface of a dielectric structure may project from such surface; may be flush with such surface; or may be recessed relative to such surface and exposed through a hole or depression in the dielectric. In one example, the conductive elements 28 can be flat, thin elements that are exposed at first surface 43 of encapsulation layer 42. Conductive elements 28 can have any suitable shape and in some cases can be circular. Conductive elements 28 may be electrically interconnected with one another, to microelectronic element 22, or both, by traces 31. Conductive elements 28 can also be formed along front surface 20 of microelectronic element 22.

Figure 12:
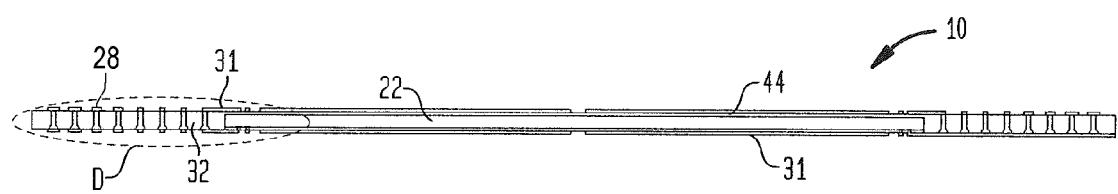
FIG. 12 shows a side view of the package of Fig. in a further optional process step of the method.
Figure 13:
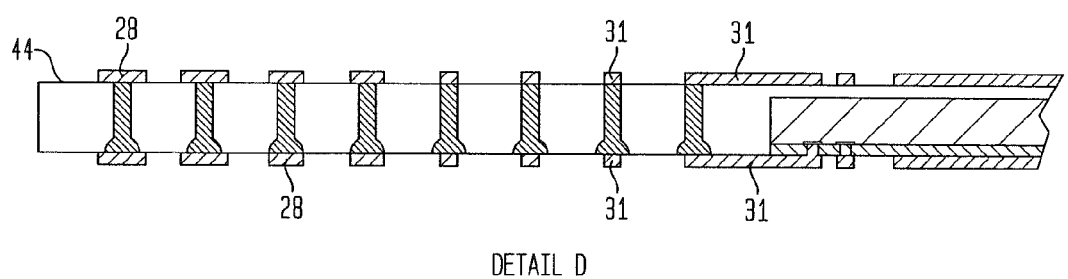
FIG. 13 shows a detail view of a portion of the package of FIG. 11 as indicated by area or detail D.

As shown in FIGS. 12 and 13, additional conductive elements 28 can be exposed at a second surface 44 of encapsulation layer 42. Such conductive elements 28 can overlie and electrically connect with end surfaces 38 of wire bonds 32. In other variations, such conductive elements can include pads that are displaced in at least one lateral direction along surface 44 from a corresponding wire bond, to which they can be connected at an end surface thereof by a trace 31.

Wire bonds 32 can be joined to at least some of the conductive elements 28, such as on the faces thereof. Wire bonds 32 can be joined at a base 34 thereof to the conductive elements 28 and can extend to an end 36 remote, i.e. opposite, from the respective bases 34 and from first surface 43. The ends 36 of wire bonds 32 can be characterized as being "free" in that they are not electrically connected or otherwise joined to microelectronic element 22 or any other conductive features within microelectronic package 10 that are, in turn, connected to microelectronic element 22. In other words, free ends 36 are available for electronic connection, either directly or indirectly as through a conductive element 28 or other features discussed herein, to a conductive feature external to package 10. The fact that ends 36 are held in a predetermined position by, for example, encapsulant layer 42 or otherwise joined or electrically connected to another conductive feature does not mean that they are not "free" as described herein, so long as any such feature is not electrically connected to microelectronic element 22. Conversely, bases 34 may not be free as they can be either directly or indirectly electrically connected to microelectronic element 22, as described herein. As shown in FIG. 10, bases 34 can be rounded in shape, extending outward from an edge surface 37 of wire bond 32 defined between base 34 and end 36. The particular size and shape of base 34 can vary according to the type of material used to form wire bond 32, the desired strength of the connection between wire bond 32 and conductive element 28, or the particular process used to form wire bond 32. Exemplary methods for making wire bonds 32 are described in U.S. Pat. No. 7,391,121 to Otremba, in U.S. Pat. App. Pub. No. 2005/0095835 (describing a wedge-bonding procedure that can be considered a form of wire bonding), and in commonly-assigned U.S.

patent application Ser. Nos. 13/462,158; 13/404,408; 13/405,108; 13/405,125; and 13/404,458, the disclosures of which are incorporated herein by reference in their entireties.

Wire bonds 32 are formed by bonding a metal wire made of copper, gold, nickel, solder, aluminum, or metal alloy, among others, at a surface thereof and performing one or more other steps so as to form a wire bond having a base and an unencapsulated surface remote, e.g., opposite, therefrom with a length of the wire extending therebetween. Additionally, wire bonds 32 can be made from combinations of materials, such as from a core of a conductive material, such as copper or aluminum, for example, with a coating applied over the core. The coating can be of a second conductive material, such as aluminum, nickel, platinum, or palladium, among others. Alternatively, the coating can be of an insulating material, such as an insulating jacket. In an embodiment, the wire used to form wire bonds 32 can have a thickness, i.e., in a dimension transverse to the wire's length, of between about 15 µm and 150 µm. In general, wire bonds 32 can be formed on a metal bonding surface, i.e. a first metal bonding surface of a structure using a wire bond tool. In other embodiments, including those in which wedge bonding is used, such as described below, wire bonds 32 can have a thickness of up to about 500 µm. A leading end of a wire segment is heated and pressed against the receiving surface to which the wire segment bonds, typically forming a ball or ball-like base 34 joined to the surface of the conductive element 28. The desired length of the wire segment to form the wire bond is drawn out of the bonding tool, which can then sever or cut the wire bond at the desired length. Wedge bonding, which can be used to form wire bonds of aluminum, for example, is a process in which the heated portion of the wire is dragged across the receiving surface to form a wedge that lies generally parallel to the surface. The wedge-bonded wire bond can then be bent upward, if necessary, and extended to the desired length or position before cutting. In a particular embodiment, the wire used to form a wire bond can be cylindrical in cross-section. Otherwise, the wire fed from the tool to form a wire bond or wedge-bonded wire bond may have a polygonal cross-section such as rectangular or trapezoidal, for example.

Figure 6:
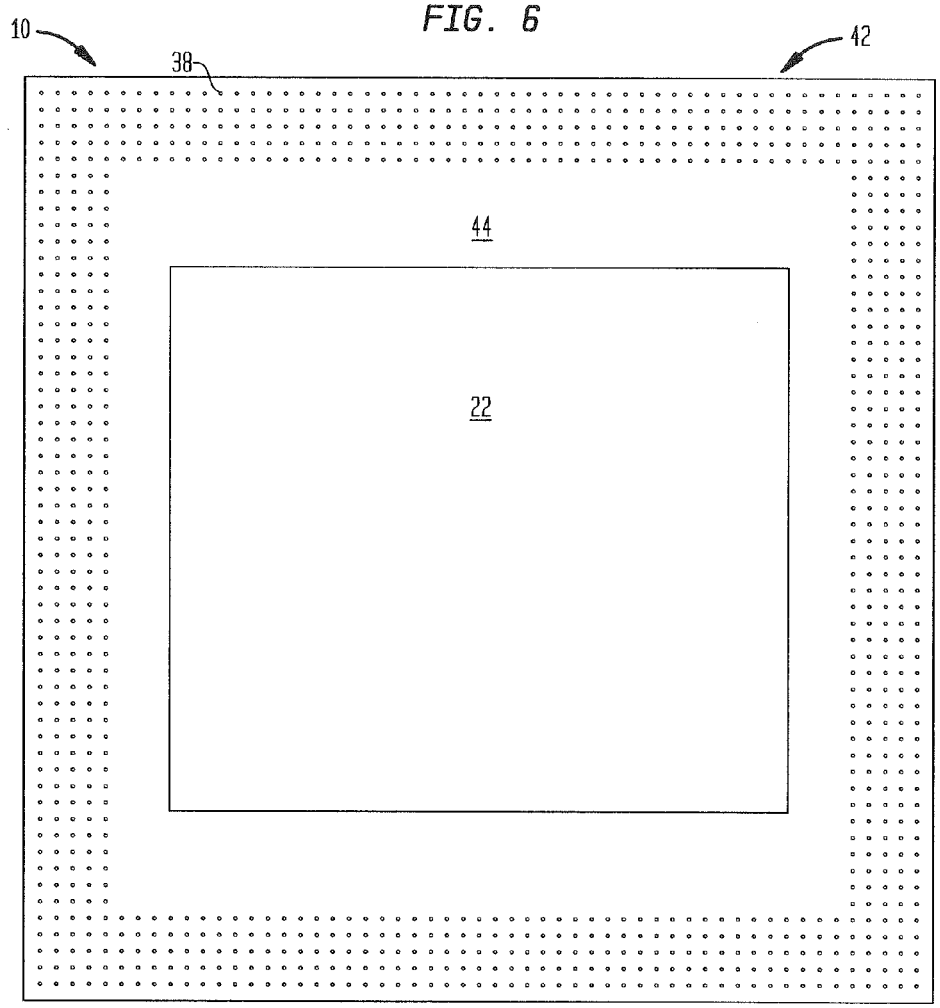
FIG. 6 shows a top view of the in-process unit of FIG. 1 in a further process step of the method.
Figure 24:
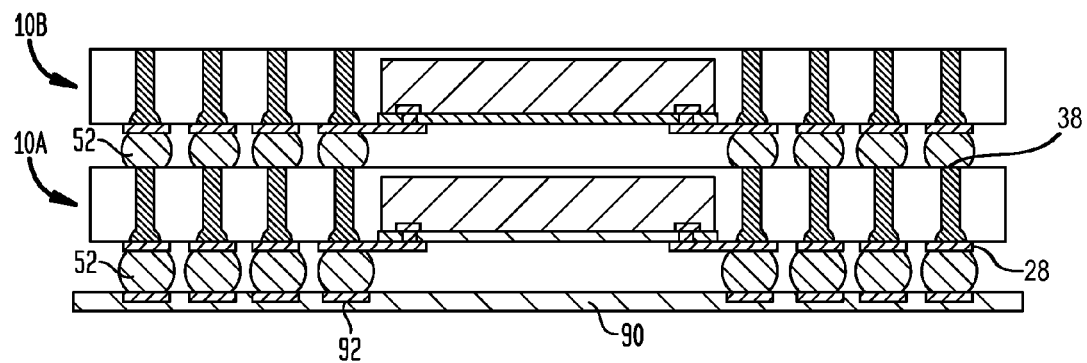
FIG. 24 shows an example of a microelectronic assembly that can include one or more packages according to various embodiments shown herein.

The free ends 36 of wire bonds 32 can define respective end surfaces 38. End surface 38 can form at least a part of a contact in a pattern such as a grid or an array formed by respective end surfaces 38 of a plurality of wire bonds 32. FIGS. 6 and 7 show an exemplary pattern for such an array of contacts formed by end surfaces 38. Such an array can be formed in an area array configuration, variations of which could be implemented using the structures described herein. In a variation of that shown, there need not be end surfaces of a wire bond at every position of the grid or array pattern in FIG. 6. Such an array can be used to electrically and mechanically connect the microelectronic package 10 to another microelectronic structure, such as to a printed circuit board ("PCB"), or to other packaged microelectronic elements, an example of which is shown in FIG. 24. In such a stacked arrangement, wire bonds 32 and conductive elements 28 can carry multiple electronic signals therethrough, each having a different signal potential to allow for different signals to be processed by different microelectronic elements in a single stack. The grid or array pattern in which end surfaces 38 are disposed at certain positions that can be disposed at positions thereof that are the same as or different than the grid or array pattern in which bases 34 are disposed. In the example shown in FIG. 9, where wire bonds 32 are generally vertically arranged, such arrays may be identical.

Figure 23:
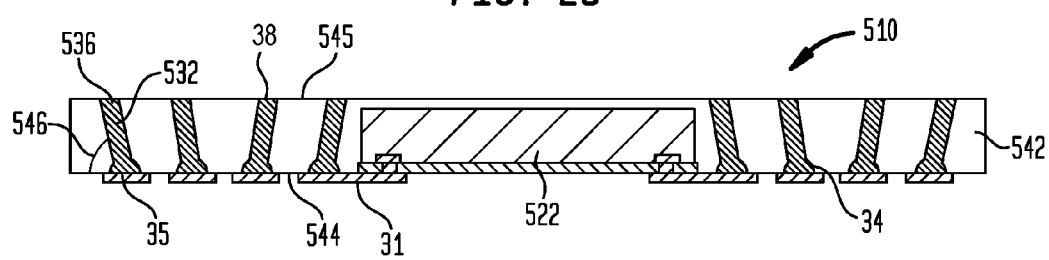
FIG. 23 shows a further alternative microelectronic package.

In other arrangements, such as that shown in FIG. 23 can include wire bonds 532 that are angled 546 with respect to surface 544 of encapsulation layer 542 such that the array of end surfaces 38 has a greater pitch than that of bases 34. An inverse of such an arrangement is also possible. Further, as discussed above, conductive elements 28 can be laterally displaced from end surfaces 35 or 38 to which they are electrically connected by traces 31. This arrangement can also provide for different pitches over surfaces 544 and 545 or other different arrangements of contacts.

As shown in FIG. 24 such a package 10 can be arranged in a stack with other similar packages or the like. While FIG. 24 shows two such microelectronic packages 10A, 10B, three, four or even more can be arranged in such a stack, which can also be assembled with a circuit panel 90 with solder masses 52 joining conductive elements 28 to panel contacts 92. Solder masses 52 can also be used to interconnect the microelectronic assemblies in such a stack, such as by electronically and mechanically attaching end surfaces 38 to conductive elements 28 or connecting conductive elements 28 to other conductive elements 28.

Encapsulation layer 42 serves to protect the other elements within microelectronic package 10, particularly wire bonds 32. This allows for a more robust structure that is less likely to be damaged by testing thereof or during transportation or assembly to other microelectronic structures. Encapsulation layer 42 can be formed from a dielectric material with insulating properties such as that described in U.S. Patent App. Pub. No. 2010/0232129, which is incorporated by reference herein in its entirety.

As discussed above, FIG. 23 shows an embodiment of microelectronic assembly 510 having wire bonds 532 with ends 536 that are not positioned directly above the respective bases 34 thereof. That is, considering first surface 544 of assembly 510 as extending in two lateral directions, so as to substantially define a plane, end 536 or at least one of the wire bonds 532 is displaced in at least one of these lateral directions from a corresponding lateral position of base 34. As shown in FIG. 23, wire bonds 532 can be substantially straight along the longitudinal axis thereof, as in the embodiment of FIG. 9, with the longitudinal axis being angled at an angle 546 with respect to a first surface 544 of encapsulation layer 542. Although the cross-sectional view of FIG. 23 only shows the angle 546 through a first plane perpendicular to first surface 544, wire bond 532 can also be angled with respect to second surface 545 in another plane perpendicular to both that first plane and to second surface 545. Such an angle can be substantially equal to or different than angle 546. That is the displacement of end 536 relative to base 34 can be in two lateral directions and can be by the same or a different distance in each of those directions.

In an embodiment, various ones of wire bonds 532 can be displaced in different directions and by different amounts throughout the assembly 510. Such an arrangement allows for assembly 510 to have an array that is configured differently on the level of surface 544 compared to on the level of surface 545. For example, an array can cover a smaller overall area or have a smaller pitch on surface 544 than at the second surface 545 level. Further, some wire bonds 532 can have ends 536 that are positioned above microelectronic element 522 to accommodate a stacked arrangement of packaged microelectronic elements of different sizes. In another embodiment, wire bonds can achieve this lateral displacement by including curved portions therein. Such curved portions can be formed in an additional step during the wire bond formation process and can occur, for example, while the wire portion is being drawn out to the desired length. This step can be carried out using available wire-bonding equipment, which can include the use of a single machine. Such curved portions can take on a variety of shapes, as needed, to achieve the desired positions of the ends of the wire bonds. For example, curved portions can be formed as S-curves of various shapes.

Figure 1:
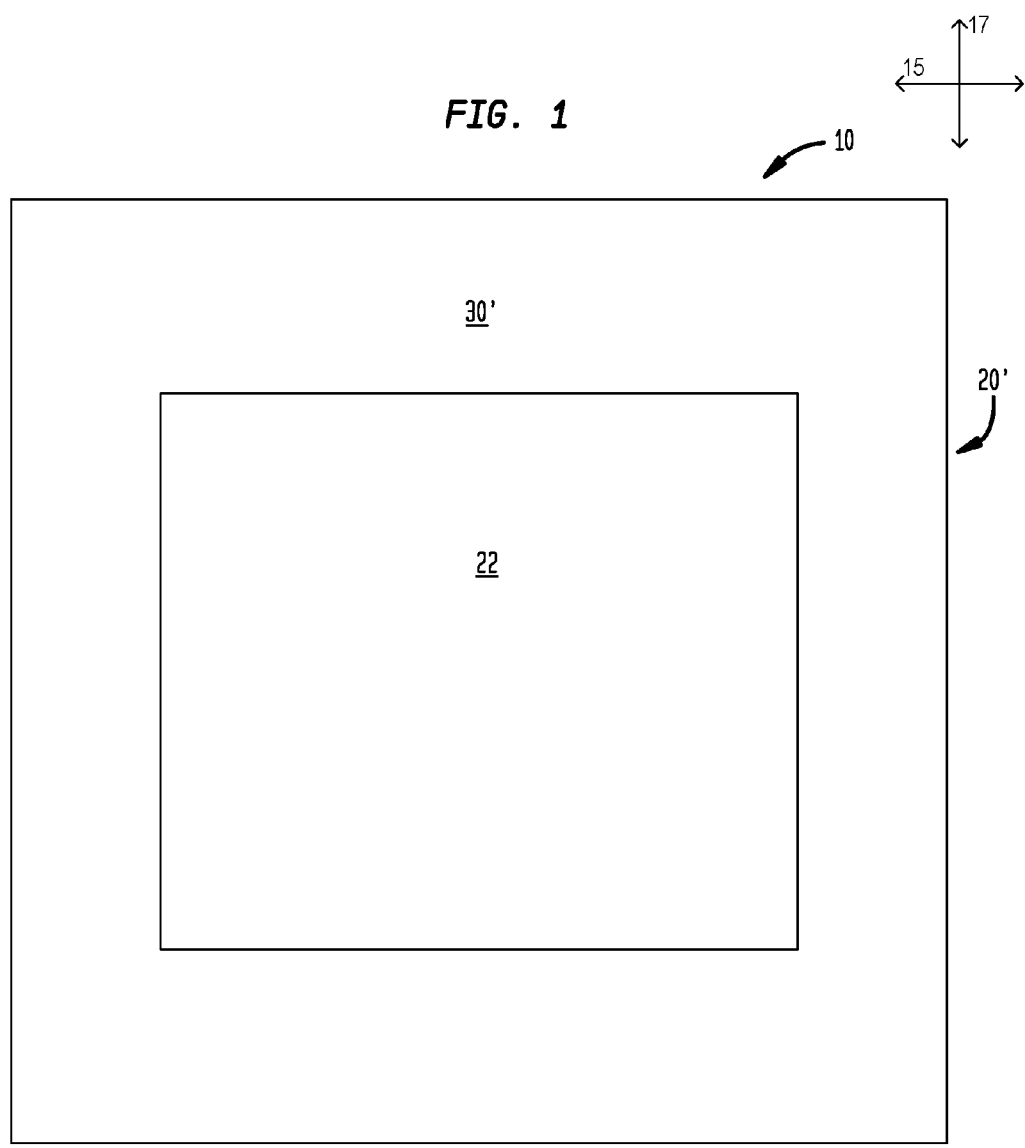
FIG. 1 shows a top schematic view of an in-process unit that can be processed to form a microelectronic package by steps according to a method of the present disclosure.
Figure 2:
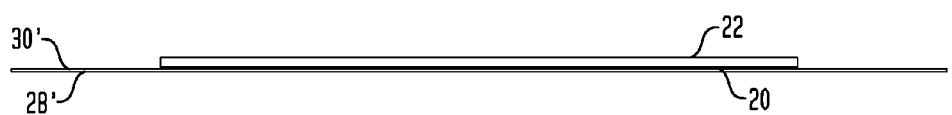
FIG. 2 shows a side elevation of the in-process unit of FIG. 1.

FIGS. 1-8 show a microelectronic package 10 in various steps of a fabrication method thereof. FIGS. 1 and 2 show microelectronic package 10 at a step where microelectronic element 22 has been bonded to a structure comprising a patternable metallic element 28'. The structure may include or consist of a metallic or other electrically conductive material layer extending in first and second transverse directions 15, 17 to define a general shape of package 10, as can be seen in the plan view of FIG. 1. Microelectronic element 22 can be assembled, e.g., bonded, to the conductive material layer 28' using an adhesive layer or polymeric material which is not fully cured. In some embodiments, the structure may include a support layer or device, e.g., a carrier to support the conductive material layer 28' during at least some steps during fabrication. Such a support layer can be removed after formation of the encapsulation layer 42.

Figure 3:
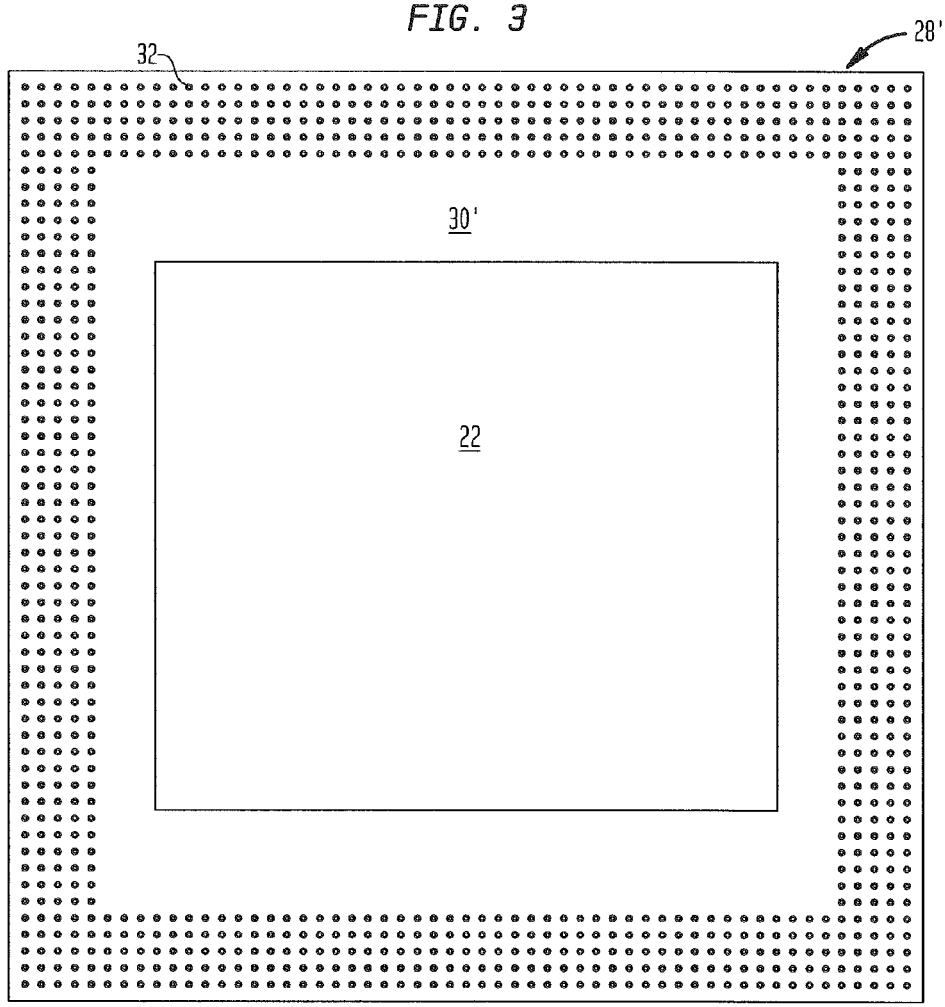
FIG. 3 shows a top view of the in-process unit of FIG. 1 in a further process step of the method.
Figure 4:
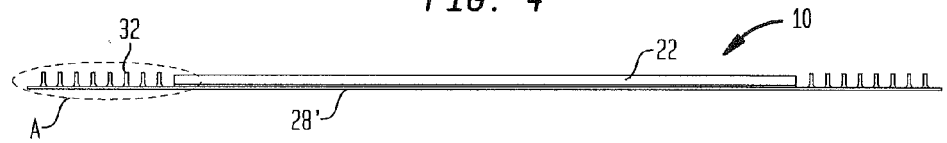
FIG. 4 shows a side elevation view of the in-process unit of FIG. 3.
Figure 5:
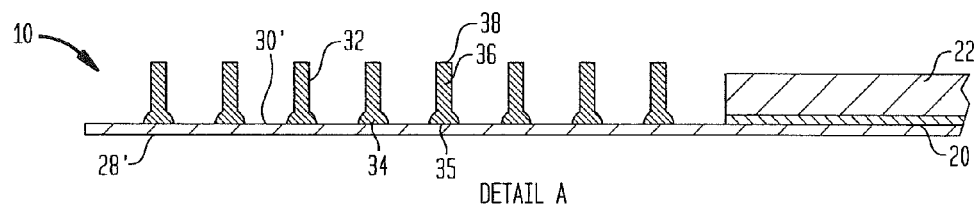
FIG. 5 shows a detail view of a portion of the in-process unit of FIG. 4 as indicated by area or detail A.

FIGS. 3, 4 and 5 show microelectronic package 10 having wire bonds 32 joined at predetermined locations on surface 30' of conductive material layer 28'. As discussed, wire bonds 32 can be applied by heating an end of a wire segment to soften the end such that it forms a deposition bond to conductive element 28 when pressed thereto, forming base 34. The wire is then drawn out away from conductive element 28 and manipulated, if desired, in a specified shape before being severed to form end 36 and end surface 38 of wire bond 32. Alternatively, wire bonds 32 can be formed from, for example, an aluminum wire by wedge bonding. Wedge bonding is formed by heating a portion of the wire adjacent the end thereof and dragging it along the conductive element 28 with pressure applied thereto. Such a process is described further in U.S. Pat. No. 7,391,121, the disclosure of which is hereby incorporated by reference herein in its entirety, and in previously-referenced U.S. patent application Ser. No. 13/402,158.

In FIGS. 6-8 encapsulation layer 42 has been added to microelectronic package 10 by being applied over surface 30' of conductive material layer 28', extending upwardly therefrom and along edge surfaces 37 of wire bonds 32. Encapsulation layer 42 can also extend along at least a portion of microelectronic element 22, including over at least one of the front face, rear face, or edge surface thereof. In other examples, the encapsulation layer 42 can be formed such that it does not contact any portions of microelectronic element 22, such as by being laterally spaced away therefrom. Encapsulation layer 42 can be formed by depositing an encapsulant, e.g., a resin over the stage of microelectronic package 10 shown in FIG. 4. In one example, this can be done by placing package 10 in an appropriately configured mold having a cavity in the desired shape of the encapsulation layer 42 that can receive package 10. Such a mold and the method of forming an encapsulation layer therewith can be as shown and described in U.S. Pat. App. Pub. No 2010/0232129, the disclosure of which is incorporated by reference herein it its entirety. Alternatively, encapsulation layer 42 can be prefabricated to the desired shape from an at least partially compliant material. In this configuration, compliant properties of the dielectric material allow encapsulation layer 42 to be pressed into position over wire bonds 32 and microelectronic element 22. In such a step, wire bonds 32 penetrate into the compliant material forming respective holes therein, along which encapsulation layer 42 contacts edge surfaces 37. Further, microelectronic element 22 may deform the compliant material so that it can be received therein. The compliant dielectric material can be compressed to expose end surfaces 38 on outer surface 44. Alternatively, any excess compliant dielectric material can be removed from encapsulation layer to form a surface 44 on which end surfaces 38 of wire bonds 32 are uncovered.

In an example, the encapsulation layer 42 can be formed such that, initially, surface 44 thereof is spaced above end surfaces 38 of wire bonds 32. To expose the end surfaces 38, the portion of encapsulation layer 42 that is above end surfaces 38 can be removed, exposing a new surface 44 that is substantially flush with end surfaces 38, as shown in FIG. 7. In a further alternative, encapsulation layer 42 can be formed such that surface 44 is already substantially flush with end surfaces 38 or such that surface 44 is positioned below end surfaces 38. Removal, if necessary, of a portion of encapsulation layer 42 can be achieved by grinding, dry etching, laser etching, wet etching, lapping, or the like. If desired, a portion of the ends 36 of wire bonds 32 can also be removed in the same, or an additional, step to achieve substantially planar end surface 38 that are substantially flush with surface 44. In a particular example, the encapsulation can be applied over the microelectronic element 22, wire bonds 34, and patternable conductive element 28' without using a mold and excess encapsulant can be removed after the application thereof to expose the end surfaces of the wire bonds, e.g., by polishing or one or more of the above methods.

After formation of dielectric layer 42, conductive material layer 28' can be patterned, by chemical or mechanical etching (such as laser etching or the like), to make conductive elements 28 and/or traces 31 by removing portions of conductive material layer 28' and leaving the portions thereof in the desired locations and form of the desired conductive elements 28 or traces 31. This can be done to make selective interconnections between wire bonds 32 and contacts 24 of microelectronic element 22 or to form conductive elements 28 displaced from respective wire bonds 32 with which they can be connected by traces 31. In some embodiments, conductive vias 25 can be formed to connect traces 31 or conductive features 28 in the form of pads with the microelectronic contacts 24.

Figure 11:
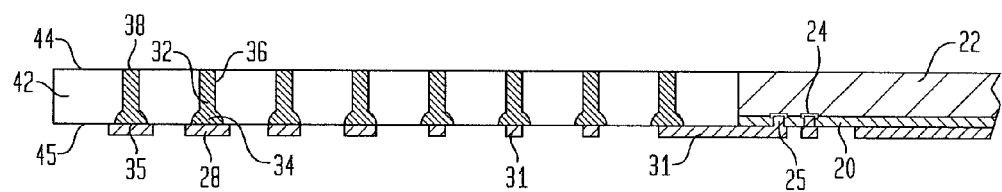
FIG. 11 shows the detail view of FIG. 10 after a further optional process step of the method.

As shown in FIG. 11, the package 10 can then be thinned to planarize surface 44 and end surfaces 38 of wire bonds 32. This can include exposing a surface of microelectronic element 22 on surface 44, which can also include thinning of microelectronic element 22 itself. Additionally or alternatively, conductive features 28 and/or traces 31 can be formed over surface 44, as described above. This can be done by depositing or joining a conductive layer over surface 44 and then patterning the layer to form such conductive elements 28 and traces 31.

FIGS. 16 and 17 show a microelectronic package 110 that is similar in construction to that shown in FIG. 10 but with microelectronic element 122 in a "face-up" arrangement. In such an arrangement, microelectronic contacts 124 are disposed toward surface 144 of encapsulation layer 142. Further, microelectronic element 122 can connect with the pattern of wire bonds 132 by conductive features 128 and traces 131 that are exposed at surface 144. As shown in FIGS. 16 and 17, such traces 131 and conductive elements 128 can connect with microelectronic contacts 124 by metalized vias 125 that extend from surface 144 to the contacts 124.

As illustrated in FIG. 16, the routing achieved by traces 131 and conductive elements 128 exposed on surface 144 can be the only routing in package 110, with surface 145 being ground down to remove conductive material layer 128' (FIG. 15), which can also remove further encapsulation material, bases 134, and all or a portion of the attachment layer 120. Alternatively, as shown in FIG. 16 electrically conductive routing elements can also be included on surface 145 that can be for purposes or redistribution of wettable contacts in the array over surface 145. In other examples, a designated wire bond can connect with the microelectronic element 122 by routing over surface 144, which can, in turn connect with other wire bonds by routing over surface 145 that is connected with such designated wire bonds.

Figure 14:
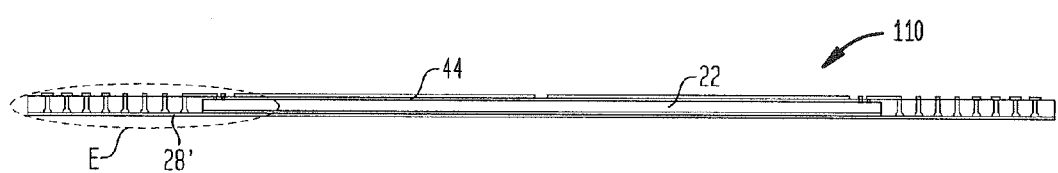
FIG. 14 shows an alternative in-process unit that can be processed to form a microelectronic package by steps according to variation of a method of the present disclosure.
Figure 15:
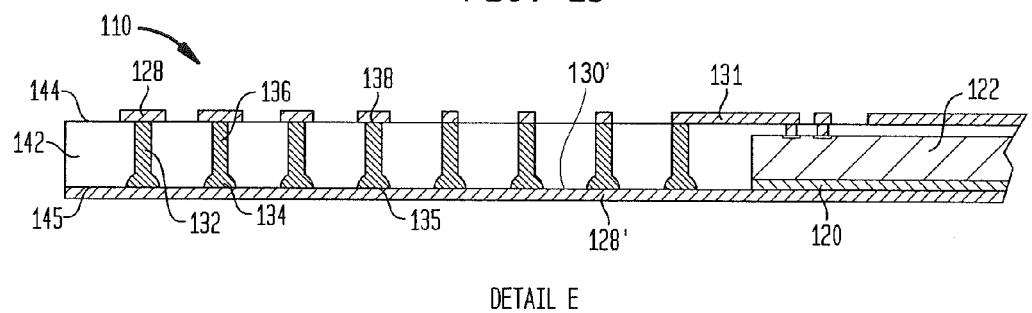
FIG. 15 shows a detail view of a portion of the in-process unit of FIG. 13 as indicated by area E.

FIGS. 14 and 15 show microelectronic package 110 in process steps that can lead to either of the completed packages 110 shown in FIGS. 16 and 17. Specifically, FIGS. 14 and 15 show package 110 with microelectronic element 122 bonded, face-up, on conductive material layer 128'. Similarly, wire bonds 132 have been joined to surface 130' of conductive material layer 128' and formed according to any one of the processes described above. Further, encapsulation layer 142 has been deposited over exposed portions of surface 130' and over wire bonds 132 and microelectronic element 122, according to any of the various processes described above. Routing circuitry in the form of conductive elements 128 and traces 131 were then formed over surface 144 of encapsulation layer 142 to connect wire bonds 132 with microelectronic element 122.

At such a point, package 110 can be further processed by grinding, polishing, lapping or other techniques as described above to remove material to result in the package 110 shown in FIG. 16. Alternatively, additional routing can be formed by patterning conductive material layer 128' to form conductive elements 128 and traces 131 in the desired configuration, as described above with respect to FIGS. 9 and 10.

Figure 18:
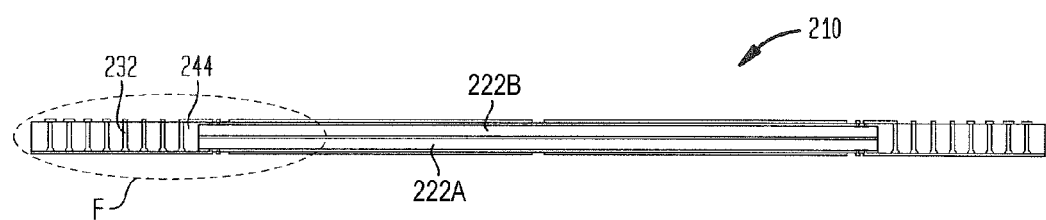
FIG. 18 shows an alternative microelectronic package.
Figure 19:
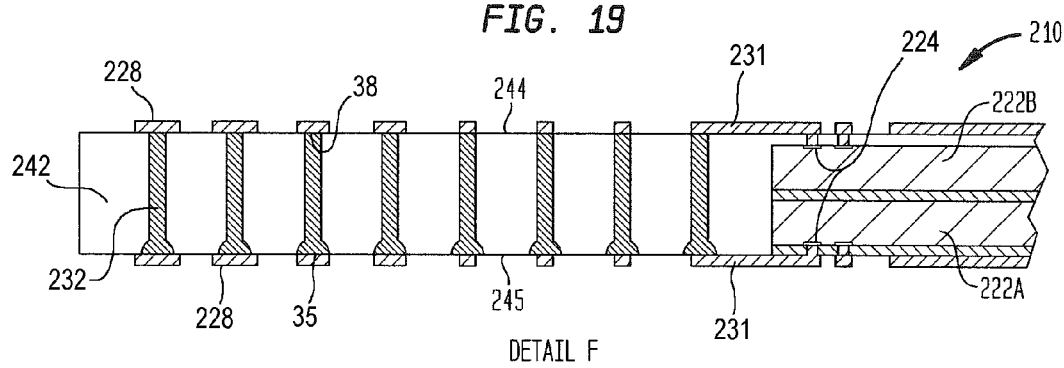
FIG. 19 shows a detail view of a portion of the package of FIG. 18 as indicated by area F.

FIGS. 18-22 show various arrangements of packages of a similar general structure to those described above but utilizing multiple microelectronic elements. In one example, FIGS. 18 and 19 show a microelectronic package 210 having one microelectronic element 222A embedded within encapsulation layer 242 in a face-down arrangement and another microelectronic element 222B in a face-up arrangement. Such a package 210 can utilize electrically conductive routing circuitry in the form of interconnected conductive elements 228 and traces 231 over both surface 244 and surface 245 of encapsulation layer 242. Additionally, designated wire bonds 232 can be used to electrically connect microelectronic element 222A with microelectronic element 222B by routing circuitry that connects with such a designated wire bond over each end surface 35 and 38 and respectively to at least one contact 224 of each of microelectronic elements 222A and 222B. Such a package 210 can be made by a method that is similar to those described above with respect to FIGS. 1-16.

Figure 20:
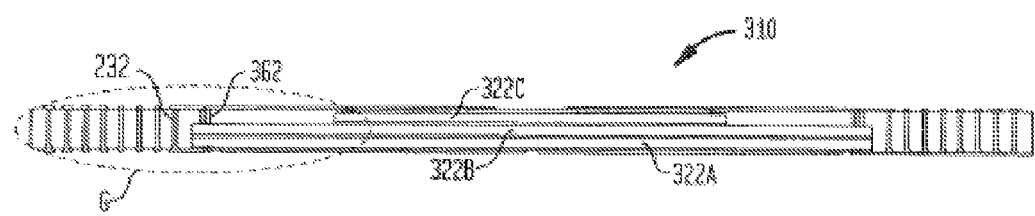
FIG. 20 shows a further alternative microelectronic package.
Figure 21:
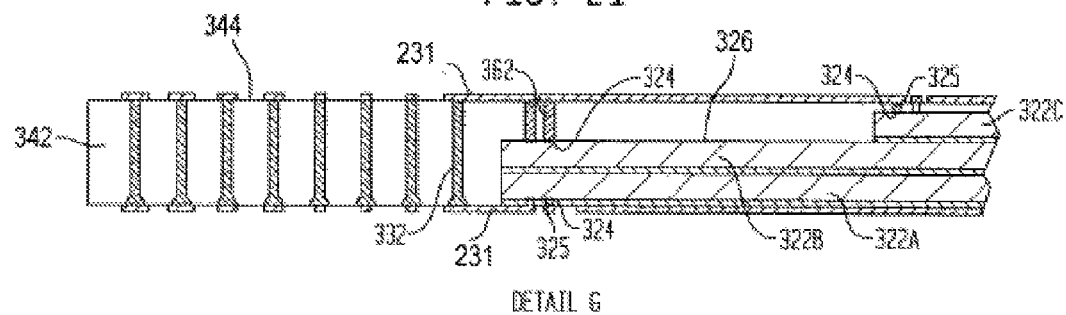
FIG. 21 shows a detail view of a portion of the package of FIG. 20 as indicated by area G.

FIGS. 20 and 21 show an arrangement of a microelectronic package 310 that is similar to that shown in FIGS. 18 and 19, but with an additional microelectronic element 322C in a face-up arrangement bonded over face 326 of microelectronic element 322B. To facilitate connection of microelectronic element 322B to electrically conductive routing circuitry over surface 344, microelectronic element 322C can be smaller than microelectronic element 322B or can be offset therefrom such that contacts 324 of microelectronic element 322B are uncovered by microelectronic element 322C. Such a connection can be achieved by metalized vias 325 that connect with the element contacts 324 or by additional wire bonds 362 that are joined to contacts 324 of microelectronic element 322B and are uncovered by encapsulation layer 342 on surface 344. As discussed above, routing between any of the microelectronic element 322A, 322B, and 322C can be achieved by designated wire bonds 332 with appropriately configured routing circuitry connected therewith.

Figure 22:
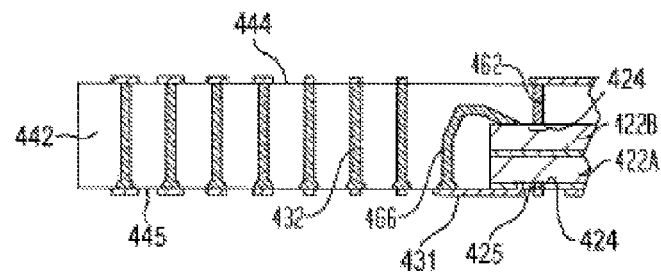
FIG. 22 shows a further alternative microelectronic package.

In a further example shown in FIG. 22, a microelectronic package can be similar to that shown in FIGS. 18 and 19, but with additional wire bonds 466 that connect between one or more contacts 424 of microelectronic element 422B (which are disposed toward surface 444 of encapsulation layer 442) and a portion of the routing circuitry over surface 445 of encapsulation layer 442. In the example shown, such a wire bond 466 can be used to achieve a connection between microelectronic element 422B and microelectronic element 422A, which has contacts 424 disposed toward surface 445 of encapsulation layer 442. As shown wire bond 466, or 462, can join with a trace 431 (or a conductive element, if desired) that is further connected to a metalized via 425 that electrically connects with element contacts 424 of microelectronic element 422A, or 422B.

Figure 25:
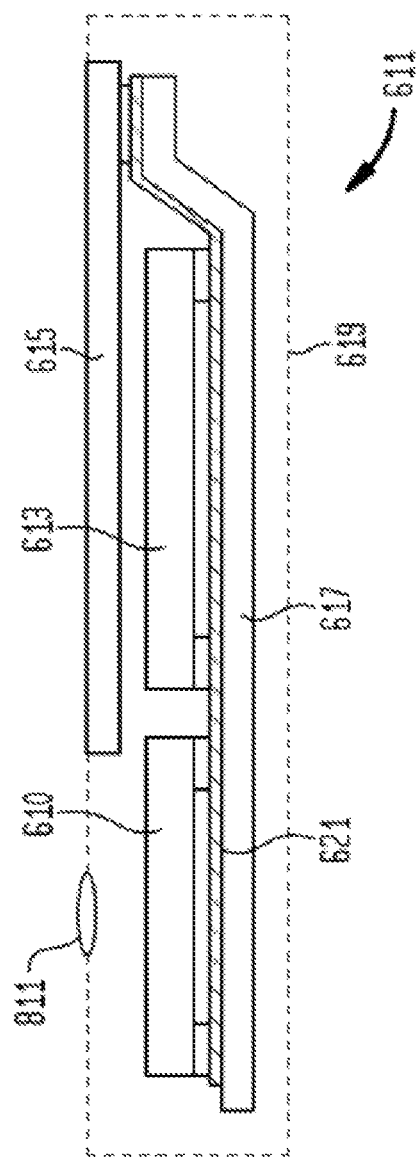
FIG. 25 depicts an example of a system which may include a package according to an implementation described herein.

The structures discussed above can be utilized in construction of diverse electronic systems. For example, a system 611 in accordance with a further embodiment includes microelectronic package 610, as described above, in conjunction with other electronic components 613 and 615. In the example depicted, component 613 is a semiconductor chip whereas component 615 is a display screen, but any other components can be used. Of course, although only two additional components are depicted in FIG. 25 for clarity of illustration, the system may include any number of such components. The microelectronic package 610 as described above may be, for example, a microelectronic package as discussed above in connection with FIG. 10, or a structure incorporating plural microelectronic packages as discussed with reference to FIG. 24. Package 610 can further include any one of the embodiments described in FIGS. 13-23. In a further variant, multiple variations may be provided, and any number of such structures may be used.

Microelectronic package 610 and components 613 and 615 are mounted in a common housing 619, schematically depicted in broken lines, and are electrically interconnected with one another as necessary to form the desired circuit. In the exemplary system shown, the system includes a circuit panel 617 such as a flexible printed circuit board, and the circuit panel includes numerous conductors 621, of which only one is depicted in FIG. 25, interconnecting the components with one another. However, this is merely exemplary; any suitable structure for making electrical connections can be used.

The housing 619 is depicted as a portable housing of the type usable, for example, in a cellular telephone or personal digital assistant, and screen 615 is exposed at the surface of the housing. Where microelectronic package 610 includes a light-sensitive element such as an imaging chip, a lens 811 or other optical device also may be provided for routing light to the structure. Again, the simplified system shown in FIG. 25 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making a microelectronic unit, comprising:
   forming a plurality of wire bonds on a conductive bonding surface of a metallic structure, the wire bonds having bases joined to the conductive bonding surface and end surfaces disposed away from the conductive bonding surface;
   forming a dielectric layer over at least a portion of the conductive bonding surface and over first portions of the wire bonds, the first portions including the bases thereof having the dielectric layer formed thereover for covering the first portions of the wire bonds, second portions of the wire bonds including the end surfaces thereof not covered by the dielectric layer; and
   patterning the metallic structure to form conductive elements separated from one another by the dielectric layer for having the bases of the wire bonds disposed on the conductive elements.

2. The method of claim 1, wherein at least some of the wire bonds are formed with the end surfaces thereof displaced in one or more lateral directions away from the bases thereof.

3. The method of claim 1, wherein:
   the bases are in a first pattern having a first minimum pitch; and
   the second portions of the wire bonds are in a second pattern having a second minimum pitch greater than the first minimum pitch.

4. The method of claim 1, wherein:
   the bases are in a first pattern having a first minimum pitch; and
   the second portions of the wire bonds are in a second pattern having a second minimum pitch less than the first minimum pitch.

* * * * *